(12) United States Patent
Baker et al.

(10) Patent No.: US 6,208,280 B1
(45) Date of Patent: Mar. 27, 2001

(54) CONVERTING A PULSE-WIDTH MODULATION SIGNAL TO AN ANALOG VOLTAGE

(75) Inventors: John M. Baker, Tuttle, OK (US); Edward N. Jeffrey, Garland; Robert Whyte, Jr., Dallas, both of TX (US)

(73) Assignee: Seagate Technology LLC, Scotts Valley, CA (US)

(*) Notice: Subject to any disclaimer, the term of this patent is extended or adjusted under 35 U.S.C. 154(b) by 0 days.

(21) Appl. No.: 09/326,172

(22) Filed: Jun. 4, 1999

Related U.S. Application Data

(60) Provisional application No. 60/115,380, filed on Jan. 11, 1999.

(51) Int. Cl.[7] .................................................. H03M 1/66
(52) U.S. Cl. ................................................................ 341/152
(58) Field of Search ..................................... 341/152, 155, 341/157, 158; 712/36

(56) References Cited

U.S. PATENT DOCUMENTS

| | | |
|---|---|---|
| 4,780,656 | 10/1988 | Mitchell . |
| 4,929,947 | 5/1990 | Toyama . |
| 5,008,675 | 4/1991 | Toyomaki . |
| 5,023,615 | 6/1991 | Yamada et al. . |
| 5,148,168 | 9/1992 | Masuda et al. . |
| 5,613,149 * | 3/1997 | Afek et al. .......................... 341/155 |

* cited by examiner

*Primary Examiner*—Brian Young
(74) *Attorney, Agent, or Firm*—Crowe & Dunlevy

(57) ABSTRACT

An apparatus and method for converting a pulse-width modulation (PWM) signal to an analog voltage signal. A current source is provided to supply electrical charge at a controllable rate to a ramp capacitor which, during successively occurring cycles of the PWM signal, alternatively receives electrical charge from the current source and discharges previously received electrical charge. A first sampling capacitor receives electrical charge from the ramp capacitor to output a feedback voltage to a feedback circuit to adjust the rate of electrical charge supplied by the current source, with the charge transferred to the first sampling capacitor determined in relation to the charge stored on the ramp capacitor over an entire PWM cycle. A second sampling capacitor receives electrical charge from the ramp capacitor to output the analog voltage, with the charge transferred to the second sampling capacitor determined in relation to the duty cycle of the PWM signal.

15 Claims, 7 Drawing Sheets

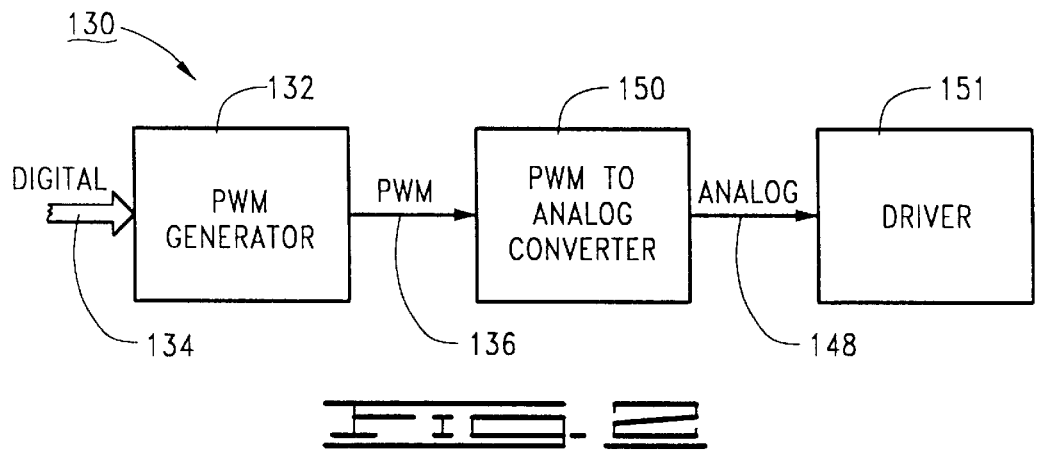
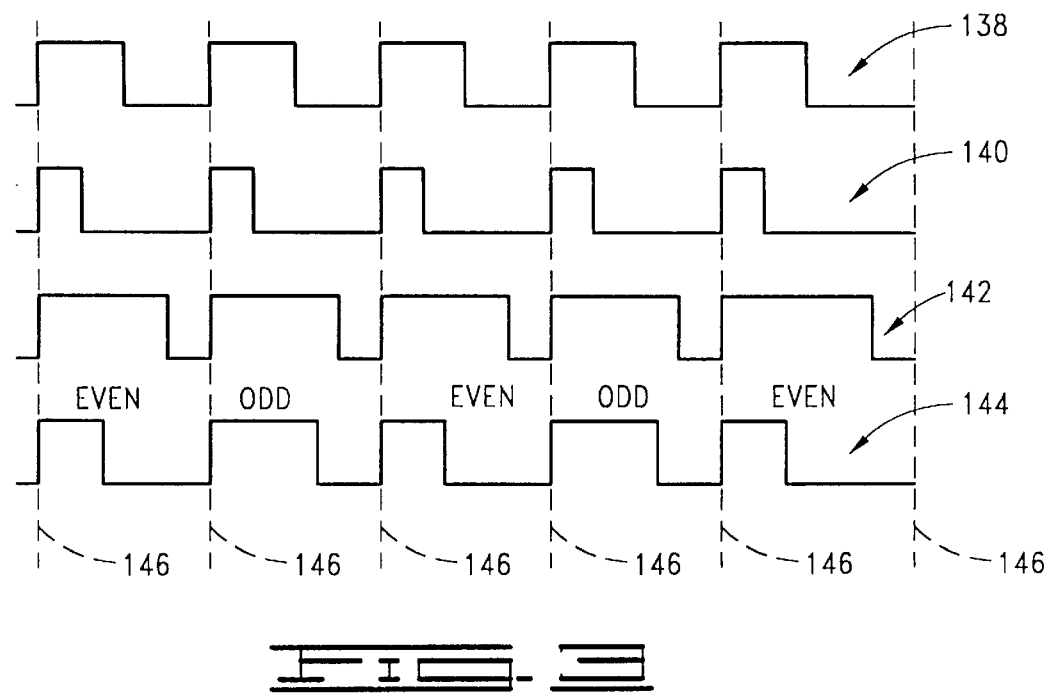

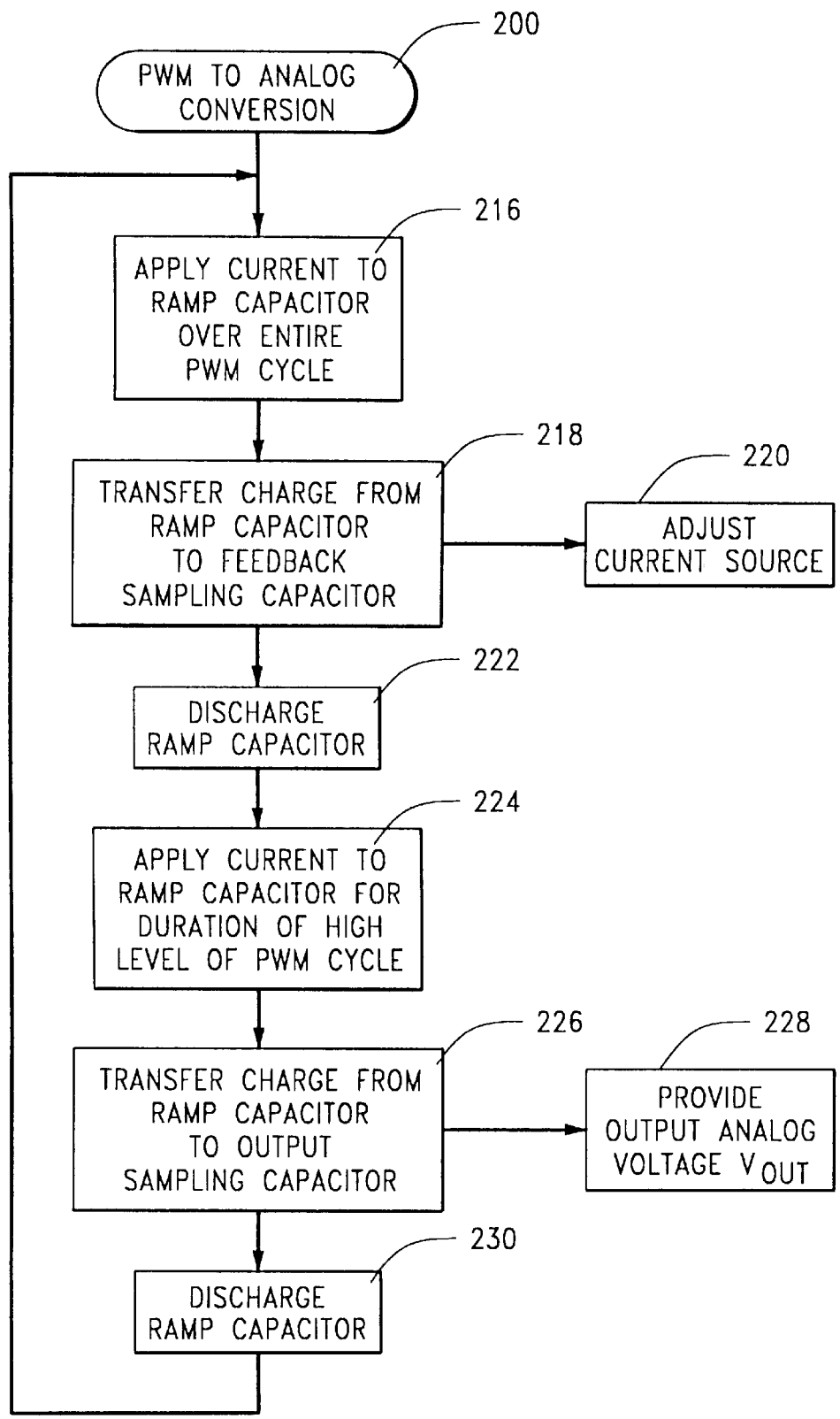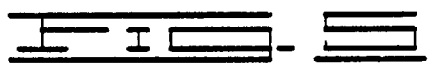

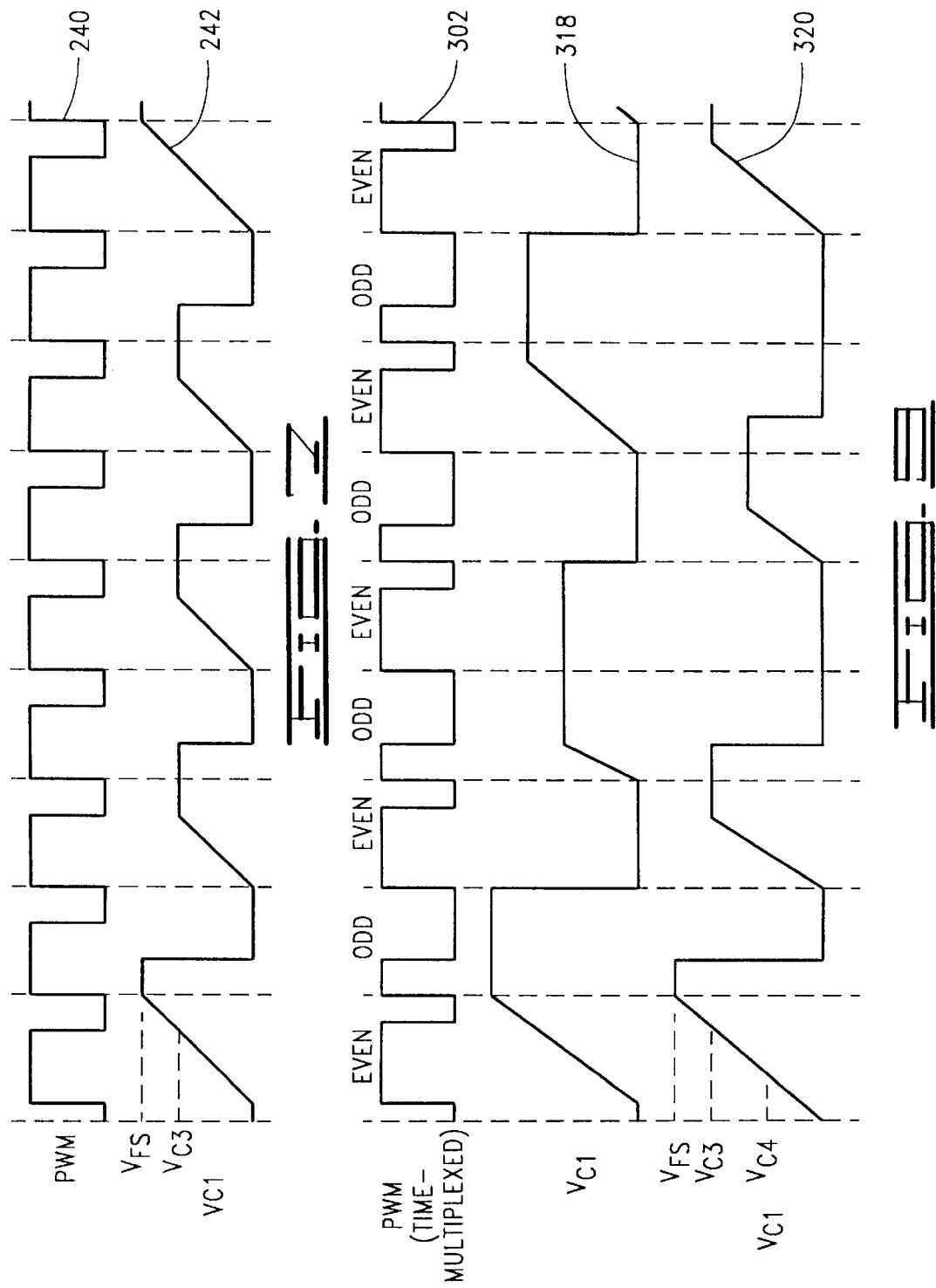

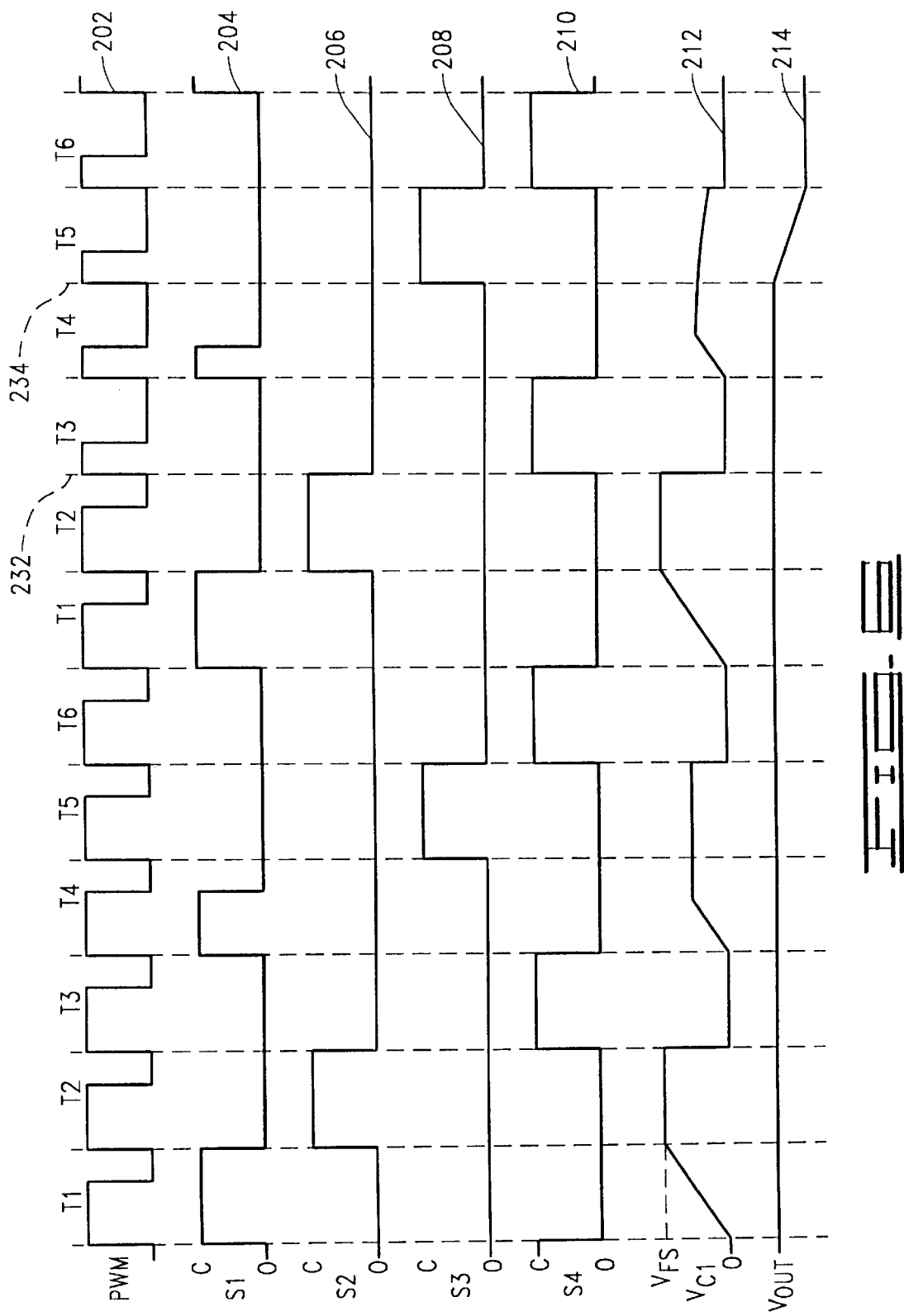

CONVERTING A PULSE-WIDTH MODULATION SIGNAL TO AN ANALOG VOLTAGE

RELATED APPLICATIONS

This application claims priority to U.S. Provisional Application No. 60/115,380 entitled METHOD FOR CONVERTING A PWM DUTY CYCLE TO AN ANALOG VOLTAGE, filed Jan. 11, 1999.

FIELD OF THE INVENTION

This invention relates generally to the field of electrical control and signal processing devices, and more particularly, but not by way of limitation, to a method and apparatus for converting a pulse-width modulation (PWM) signal to an analog voltage, the analog voltage having a magnitude indicative of a duty cycle of the PWM signal.

BACKGROUND OF THE INVENTION

Pulse-width modulation (PWM) signals are commonly used in a variety of electrical applications, such as signal processing channels and motor speed control circuitry. A PWM signal alternatively transitions between two voltage levels ("high" and "low" levels) over each of a series of successive cycles, with the cycles occurring at a selected frequency. The percentage of time that the signal is at the high level as compared to the duration of the entire cycle is commonly referred to as the duty cycle. Thus, a PWM signal with a 50% duty cycle resembles a typical square-wave signal with high and low levels of equal length.

One particularly useful application of PWM signals is in the area of motor driver circuitry for hard disc drive data storage devices ("disc drives"). A typical disc drive includes one or more rigid discs which are mechanically coupled for rotation about a spindle motor at a selected operational speed (such as 10,000 revolutions per minute). Data are magnetically stored and retrieved from tracks defined on the disc surfaces by an array of read/write heads which are controllably positionable using an actuator motor, such as a voice coil motor (VCM).

For each type of motor, it is common to generate a multi-bit digital control value indicative of the desired speed of the motor. The disc drive converts the digital control value to a PWM signal with a duty cycle indicative of the magnitude of the digital control value. In turn, the PWM signal is converted to an analog control voltage with a magnitude indicative of the PWM duty cycle, with the analog control voltage used to control the application of current to the motor. It will be recognized that in the case of the spindle motor, the analog control voltage will tend to made necessary adjustments in the rotational speed of the spindle motor to maintain this speed within a desired range, whereas in the case of the VCM, the analog control voltage controls the acceleration and deceleration of the heads as the heads are moved to positions adjacent various tracks on the discs.

Prior art circuits used to convert a PWM signal to a corresponding analog voltage have taken a variety of forms, including use of filtering to achieve the necessary conversion. While operative, limitations with such prior art methodologies include insufficient bandwidth and resolution, as well as difficulties in efficiently implementing the entire circuit into an application specific integrated circuit (ASIC). Accordingly, there is a need for an improved approach to converting a PWM signal to a corresponding analog voltage, and it is such improvements that the present invention is directed.

SUMMARY OF THE INVENTION

The present invention provides an apparatus and method for converting a pulse-width modulation (PWM) signal to a corresponding analog voltage having a magnitude indicative of the duty cycle of the PWM signal.

As exemplified by preferred embodiments, a current source supplies electrical charge at a controllable rate to a ramp capacitor which, during successively occurring cycles of the PWM signal, alternatively receives electrical charge from the current source and discharges previously received electrical charge.

A first sampling capacitor receives electrical charge from the ramp capacitor to output a feedback voltage to a feedback circuit to adjust the rate of electrical charge supplied by the current source, with the charge transferred to the first sampling capacitor determined in relation to the charge stored on the ramp capacitor over an entire PWM cycle.

A second sampling capacitor receives electrical charge from the ramp capacitor to output the analog voltage, with the charge transferred to the second sampling capacitor determined in relation to the duty cycle of the PWM signal.

These and various other features as well as advantages which characterize the present invention will be apparent from a reading of the following detailed description and a review of the associated drawings.

BRIEF DESCRIPTION OF THE DRAWINGS

FIG. 2 provides a functional block diagram of a motor driver circuit of the disc drive of FIG. 1, including a PWM to analog converter circuit constructed in accordance with preferred embodiments of the present invention.

FIG. 3 provides timing diagrams of various PWM signals.

FIG. 5 provides a flow chart for a PWM TO ANALOG CONVERSION routine, representative of steps carried out during the operation of the circuit of FIG. 4.

FIG. 6 provides timing diagrams of various signals associated with the operation of the circuit of FIG. 4.

FIG. 7 provides timing diagrams illustrating operation of an alternative preferred embodiment for the PWM to analog converter circuit.

FIG. 9 provides timing diagrams illustrating operation of alternative preferred embodiments for the PWM to analog converter circuit of FIG. 8.

DETAILED DESCRIPTION

In order to set forth a detailed description of preferred embodiments of the present invention, it will be helpful to first briefly describe a particular environment in which such embodiments can be advantageously utilized.

Figure 1:
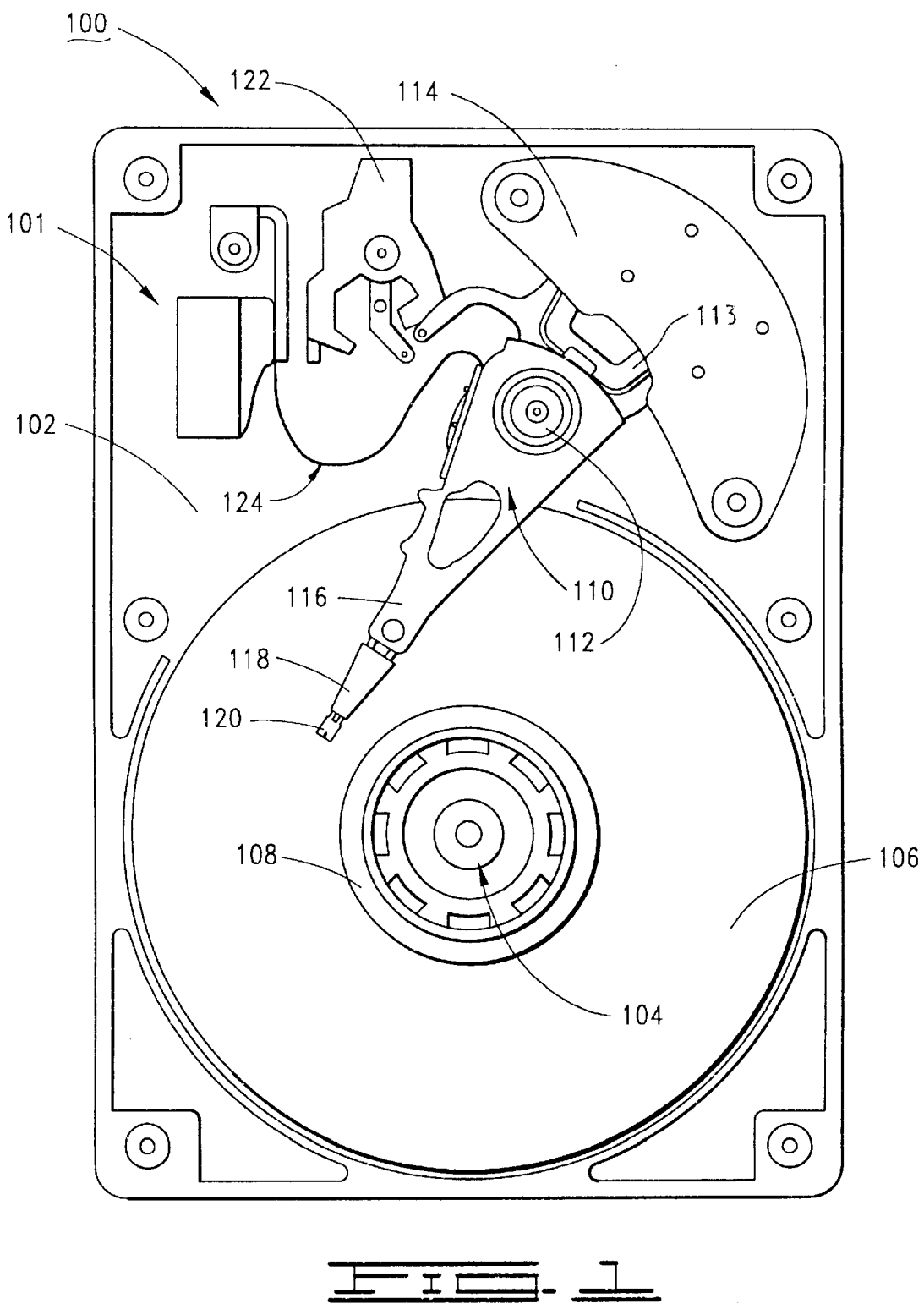
FIG. 1 provides a top plan view of a disc drive which provides an environment in which preferred embodiments of the present invention can be advantageously utilized.

FIG. 1 shows a top plan view of a disc drive 100 of the type used to store computer data. The disc drive 100 includes a head-disc assembly (HDA) 101 and a printed wiring assembly (PWA) which is mounted to the underside of the HDA and thus, not visible in FIG. 1. The PWA includes electronics used to control the operation of the HDA 101, as discussed below.

A top cover, omitted from FIG. 1 to reveal interior portions of the HDA 101, mates with a base deck 102 of the HDA 101 to provide an environmentally controlled housing. A spindle motor (generally designated at 104) is supported by the base deck 102 and rotates a plurality of discs 106 at a constant high speed. A disc clamp 108 secures the discs 106 to the spindle motor 104.

The discs 106 include recording surfaces (not separately identified) to which user data are written by way of a rotary actuator assembly 110, which rotates about a cartridge bearing assembly 112 in response to the application of current to a coil (113, a portion of which is visible in FIG. 1) of a voice coil motor (VCM) 114. A plurality of rigid arms 116 extend from the actuator assembly 110, each of which supports a corresponding flexible suspension assembly 118. A plurality of heads 120 are supported by the suspension assemblies 118 and moved across the recording surfaces of the discs 106 by the VCM 114. A latch assembly 122 secures the actuator assembly 110 when the disc drive 100 is deactivated, and a flex circuit assembly 124 facilitates electrical interconnection between the actuator assembly 110 and the disc drive PWA.

Referring to FIG. 2, shown therein is a generalized functional block diagram of relevant portions of a motor control circuit 130 of the disc drive 100, constructed in accordance with preferred embodiments to be discussed below. Separate motor control circuits are preferably provided to control the operation of the spindle motor 104 and the VCM 114.

The motor control circuit 130 includes a pulse-width modulation (PWM) signal generator 132 which receives a multi-bit digital input value on path 134 as a control signal to control the rotation of the motor. For example, the digital input value can be supplied by a digital signal processor (DSP, not shown) used as part of a servo circuit to control the radial position of the actuator 10.

In response, the PWM generator 132 outputs a PWM signal on path 136 having an informational content indicative of the magnitude of the digital input value. More particularly, FIG. 3 shows a series of representative PWM signals at 138, 140, 142 and 144. As discussed above, a PWM signal alternatively transitions between two voltage levels ("high" and "low" levels) over each of a series of successive cycles (periods). Each of the cycles shown in FIG. 3 thus extends between adjacently occurring boundaries 146 which occur at a selected frequency.

The duty cycle is the percentage of time that the signal is at the high level as compared to the duration of an entire cycle, so that the PWM signals 138, 140 and 142 have duty cycles of about 50%, 20% and 80%, respectively. A common construction of the PWM generator 132 includes the use of counter/buffer circuitry which, at the occurrence of each boundary 146, sets the output to the high level, loads the digital input value and initiates an internal count. When the count reaches the magnitude of the digital value, the output is toggled low until the next boundary 146. In this manner, the duty cycle will substantially represent the magnitude of the digital input value.

It is sometimes desirable to provide a time-multiplexed PWM signal with multiple, successively occurring duty cycles. For example, the time-multiplexed PWM signal 144 is shown to have alternating even and odd cycles with respective duty cycles of about 40% and 70%, respectively, with the even cycles representing the most significant bits of the digital input value, and the odd cycles representing the least significant bits of the digital input value. Of course, time-multiplexed PWM signals can have any number of embedded, successively occurring cycles with respective duty cycles.

With reference again to FIG. 2, the PWM signal output by the PWM generator 132 is converted to an analog voltage (path 148) by a PWM to analog converter 150 (hereinafter "converter 150"). The analog voltage has a magnitude determined in relation to the duty cycle (or cycles) of the input PWM signal. The analog voltage is supplied to a motor driver circuit 151 which applies current to the respective motor (the VCM 114 or the spindle motor 104) in response thereto.

Figure 4:
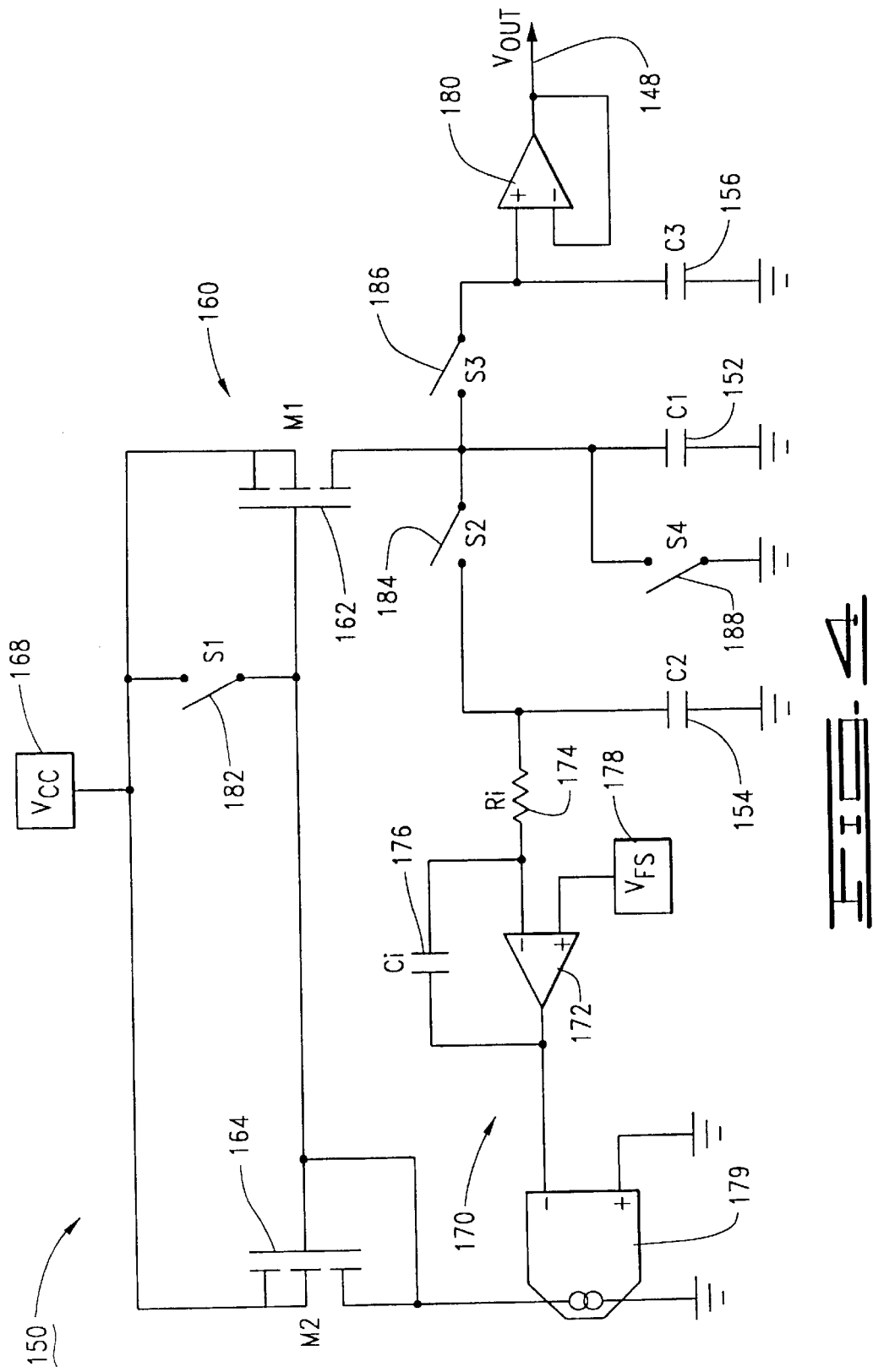
FIG. 4 is a generalized schematic diagram of a preferred embodiment of the PWM to analog converter circuit of FIG. 2.

Turning now to FIG. 4, shown therein is a schematic representation of a preferred construction of the converter 150 of FIG. 2. Initially, FIG. 4 shows a C1 ramp capacitor 152, and C2 and C3 switching capacitors 154 and 156, respectively. A current source (generally denoted at 160) supplies current (electrical charge) to the C1 ramp capacitor 152 and comprises M1 and M2 transistors 162 and 164, respectively, and a $V_{CC}$ voltage source 168, with $V_{CC}$ preferably comprising a rail voltage of nominally +5 V.

A feedback circuit 170, coupled between the C2 switching capacitor 154 and the current source 160, is provided to control the magnitude of the current from the current source 160. FIG. 4 shows the feedback circuit 170 to preferably comprise an integrator with operational amplifier 172, resistor 174, capacitor 176 and $V_{FS}$ voltage source 178, with $V_{FS}$ representing a full scale voltage for the output analog voltage (identified as "$V_{OUT}$" and output on path 148). For reference, a suitable value for $V_{FS}$ is nominally +4.4 V.

The integrator provides an integrated voltage output as an input to a transconductance amplifier 179, as shown. Other configurations for the feedback circuit can be readily implemented as desired, such as the use of a switched capacitor network in lieu of the resistor 174.

Finally, FIG. 4 shows a buffer 180 coupled to the C3 sampling capacitor 156 which buffers the output analog voltage $V_{OUT}$. S1, S2, S3 and S4 switches 182, 184, 186 and 188, respectively, are controlled using switch control logic (not shown) responsive to the input PWM signal.

The operation of the circuit of FIG. 4 can be understood with reference to FIGS. 5 and 6. FIG. 5 shows a PWM TO ANALOG CONVERSION routine 200, which illustrates various steps performed by the circuit of FIG. 4. FIG. 6 shows various timing diagrams including a representative input PWM signal at 202, switching diagrams for the S1, S2, S3 and S4 switches at 204, 206, 208 and 210, respectively, a $V_{C1}$ voltage signal at 212 indicative of the voltage on the C1 ramp capacitor, and a $V_{OUT}$ signal 214 indicative of the magnitude of the analog voltage output by the circuit on path 148. From FIG. 6 it will be noted that the converter 150 of FIG. 4 is preferably configured for operation over successive sets of six (6) PWM cycles, denoted as T1–T6. With respect to the switching diagrams 204, 206, 208 and 210, a high level indicates the respective switch is closed, while a low level indicates the switch is open.

Referring to FIG. 5, step 216 shows the application of current to the C1 ramp capacitor 152 over an entire PWM cycle (i.e., the T1 cycle of FIG. 6), resulting in the voltage on the C1 ramp capacitor 152 ramping up from nominally zero volts to a value nominally equal to the full scale voltage $V_{FS}$ at the conclusion of the T1 cycle.

At step 218, charge from the C1 ramp capacitor 152 is transferred to the C2 sampling capacitor 154 ("feedback sampling capacitor"), which preferably occurs at the transition to the T2 cycle. The voltage established on the C2 feedback sampling capacitor 154 is applied to the feedback circuit 170 to adjust the current through the M1 transistor 166 (M1 being mirrored by M2). In this manner, the full voltage to which the C1 ramp capacitor 152 charges is maintained to be nominally equal to $V_{FS}$.

The remaining charge on the C1 ramp capacitor 152 is next discharged, as indicated by step 222, with this shown to occur upon activation of the S4 switch 188 at the transition between the T2 and T3 cycles. This results in the voltage on the C1 ramp capacitor being brought down to nominally zero volts.

During the T4 cycle, the C1 ramp capacitor next receives charge from the current source 160 while the PWM cycle 202 is at the high level, as shown by step 224. This is preferably accomplished by the operation of the S1 switch 182. It will be noted that the voltage established on the C1 ramp capacitor 152 by this operation is less than the $V_{FS}$ achieved during the T1 cycle, due to the reduction in time during which the C1 ramp capacitor is charged. At step 226, charge is transferred from the C1 ramp capacitor 152 to the C3 sampling capacitor 156 ("output sampling capacitor"), thereby establishing the $V_{OUT}$ signal 214 at step 228.

Finally, FIG. 5 shows the discharge of the C1 ramp capacitor 152 at step 230 (effected by the S4 switch 188), after which the routine returns to step 216.

At this point it will be noted that the circuit of FIG. 4 preferably operates to periodically charge the C1 ramp capacitor 152 for a duration of time that alternates between the full cycle of the PWM signal and the "on-time" of the PWM signal, with charge being alternatively applied to the C2 feedback sampling capacitor 154 and the C3 output sampling capacitor 156. For clarity, FIG. 6 represents steady-state operation of the circuit of FIG. 4, i.e., it is contemplated that the circuit has been operating for a sufficient amount of time for the voltage on C2 to have nominally reached $V_{FS}$, the voltage on C3 to have nominally reached the desired $V_{OUT}$, etc.

Finally, it will be noted that the PWM signal 202 in FIG. 6 has an initial duty cycle of about 65%, after which it is reduced to about 35% at boundary 232 between the second set of T2 and T3 cycles. The circuit of FIG. 4 operates to reduce the magnitude of $V_{OUT}$ accordingly, although such reduction may take several cycles depending upon the rate of charge redistribution between the C1 ramp capacitor 152 and the C3 output sampling capacitor 156. For example, if $V1_n$ is the voltage on the C1 ramp capacitor 152 and $V3_n$ is the voltage on the C3 output sampling capacitor 156 at boundary 234 (the end of T4), then after a time constant set by the parallel combination of the two capacitances and the resistance of the S3 switch 186, both capacitors will be at the same voltage described as:

$$V_{n+1} = \frac{C1 V1_n + C3 V3_n}{C1 + C3} \quad (1)$$

by the conservation of charge. Several cycles may therefore be required for the output to reach a new value, with this response similar to a step response of a damped filter. If faster response speed is desired, a buffer (similar to the buffer 180 in FIG. 4) can be readily added to buffer the voltage on the C1 ramp capacitor 152. A buffer can also be added to buffer the transfer of charge between the C1 ramp capacitor 152 and the C2 feedback sampling capacitor 154, as desired.

Although FIG. 4 sets forth a preferred embodiment for the converter 150, numerous variations can be readily implemented, depending upon the requirements of a given application. For example, FIG. 7 shows a PWM signal 240 with corresponding $V_{C1}$ voltage signal 242 indicative of the voltage on the C1 ramp capacitor 152. In this embodiment, the full scale voltage $V_{FS}$ is only sampled once for every multiple samples for the output voltage $V_{OUT}$. This allows sampling of the PWM signal 240 every other cycle, with the transfer and discharge of the C1 ramp capacitor taking place during remaining cycles, providing high sampling rates and fast response.

A related embodiment (not separately represented) charges the C1 ramp capacitor 152 to the full scale voltage $V_{FS}$ every other cycle, with a full discharge in between. The voltage on C1 is sampled at the falling edge of the PWM signal (i.e., at the end of the on-time during each cycle) and provided to C3 while C1 continues to charge. If C1 is substantially larger than C2 and C3, or if C1 is buffered, such operation will provide minimal disturbance to the full scale voltage transferred to C2.

Figure 8:
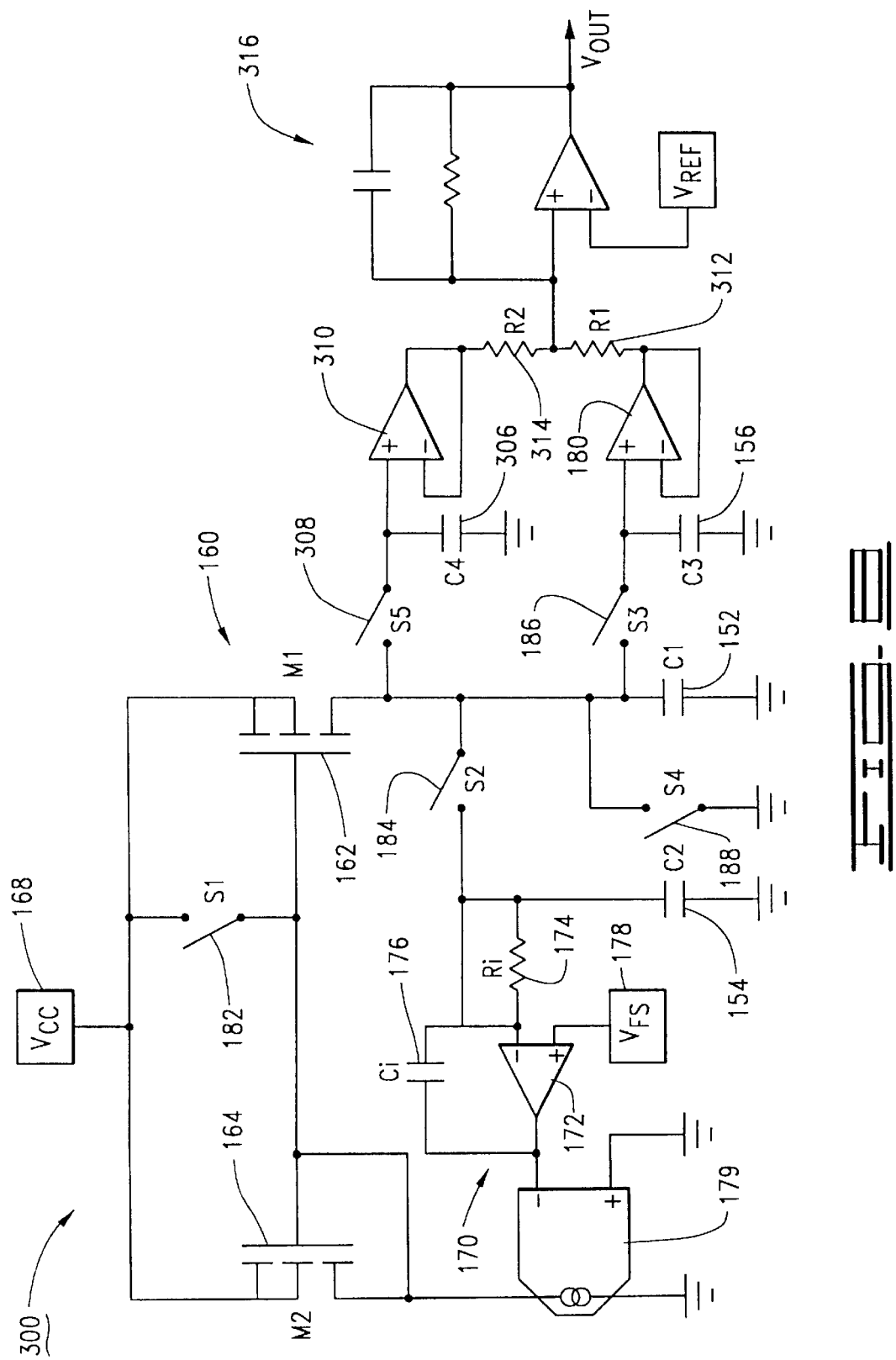
FIG. 8 is a generalized schematic diagram of another preferred embodiment of the PWM to analog converter circuit which converts a time-multiplexed PWM signal to a corresponding analog voltage.

FIG. 8 shows yet another embodiment for a PWM to analog converter circuit, generally denoted at 300. The converter 300 operates to output an analog voltage $V_{OUT}$ in relation to a time-multiplexed signal 302 shown in FIG. 9 (which is similar to the time-multiplexed signal 144 previously discussed in FIG. 3). The circuit of FIG. 8 is thus similar to the circuit of FIG. 4, and for convenience the same reference numerals are used for similar components. Differences between the two circuits include a second output capacitor 306 (denoted as C4) with corresponding S5 switch 308 and buffer 310. Also, the outputs of the buffers 180, 310 are scaled using resistors R1, R2 (at 312, 314) and summed using summing network 316. For reference, the magnitude of resistance of the R2 resistor 314 is preferably a multiple of the resistance of the R1 resistor 312 to account for the difference in magnitude between the informational content of the even and odd portions of the PWM cycle 302. $V_{REF}$ can be any suitable reference voltage.

In one preferred embodiment, the voltage on the C1 ramp capacitor 152 takes the form set forth by $V_{C1}$ signal 318 in FIG. 9 so that C1 is fully charged during the first cycle, charge is transferred to the C2 feedback sampling capacitor 154 during the second cycle, and then C1 is discharged during the third cycle.

During remaining cycles C1 operates to alternatively transfer charge to the C3 and C4 output capacitors 156 and 306 in a manner as generally discussed above.

In an alternative embodiment, charge is supplied to each of the C2, C3 and C4 capacitors using two cycles, respectively, such as illustrated by $V_{C1}$ signal 320. In yet another embodiment, as discussed above the C1 ramp capacitor 152 can be charged to the full scale voltage $V_{FS}$ every other cycle, with a full discharge in between, with the voltage on C1 sampled at the falling edges of the respective PWM cycles to charge C3 and C4.

It will now be apparent that the present invention, in accordance with the various embodiments presented herein, provides an easily implementable, highly controllable PWM to analog converter circuit that provides substantially linear analog voltage output for input PWM signals having duty cycles ranging from 0% to 100%. The periodic calibration of the current source assures maintained operation over a range of different environmental conditions, such as variations in temperature. The circuit also provides faster step output response performance than existing conversion methodologies.

In summary, the present invention is directed to an apparatus and method for converting a pulse-width modulation (PWM) signal to an analog voltage signal.

As exemplified by preferred embodiments, a current source 160 supplies electrical charge at a controllable rate to a ramp capacitor 152 which, during successively occurring cycles of the PWM signal, alternatively receives electrical charge from the current source and discharges previously received electrical charge.

A first sampling capacitor 154 receives electrical charge from the ramp capacitor to output a feedback voltage to a feedback circuit 170 to adjust the rate of electrical charge supplied by the current source, with the charge transferred to the first sampling capacitor determined in relation to the charge stored on the ramp capacitor over an entire PWM cycle.

A second sampling capacitor 156 receives electrical charge from the ramp capacitor to output the analog voltage, with the charge transferred to the second sampling capacitor determined in relation to the duty cycle of the PWM signal.

It will be clear that the present invention is well adapted to attain the ends and advantages mentioned as well as those inherent therein. While presently preferred embodiments have been described for purposes of this disclosure, numerous changes may be made which will readily suggest themselves to those skilled in the art and which are encompassed in the spirit of the invention disclosed and as defined in the appended claims.

What is claimed is:

1. An apparatus which converts a pulse-width modulation (PWM) signal to an analog voltage signal, the PWM signal comprising a series of cycles each having a first and a second level and a duty cycle expressed as a percentage of time the PWM signal is at the first level over each cycle, the analog voltage signal having a magnitude indicative of the duty cycle, the apparatus comprising:
   a current source which supplies electrical charge at a controllable rate;
   a ramp capacitor which, during selected, successively occurring cycles of the PWM signal, alternatively receives electrical charge from the current source and discharges previously received electrical charge;
   a first sampling capacitor which receives electrical charge from the ramp capacitor to output a feedback voltage to adjust the rate of electrical charge supplied by the current source; and
   a second sampling capacitor which receives electrical charge from the ramp capacitor to output the analog voltage.

2. The apparatus of claim 1, wherein the PWM signal is characterized as a time-multiplexed signal with alternating even and odd cycles having respective duty cycles, wherein the analog voltage is characterized as a first analog voltage indicative of the duty cycle of the even cycles, and wherein the apparatus further comprises:
   a third sampling capacitor which receives electrical charge from the ramp capacitor to output a second analog voltage indicative of the duty cycle of the odd cycles.

3. The apparatus of claim 1, further comprising a feedback circuit comprising an integrator which provides an integrated feedback voltage.

4. The apparatus of claim 1, wherein the feedback circuit further comprises a transconductance amplifier which converts the integrated feedback voltage to a current which adjusts the rate of electrical charge supplied by the current source.

5. The apparatus of claim 1, wherein the current source comprises:
   a voltage source; and
   a transistor operably coupled between the voltage source and the ramp capacitor, wherein conductivity of the transistor is controlled in relation to the feedback voltage.

6. A disc drive, comprising:
   a motor; and
   circuitry which controls rotational velocity of the motor, comprising:
      a rotational velocity demand circuit which outputs a pulse-width modulation (PWM) signal having a series of cycles each with a first and a second level and a duty cycle expressed as a percentage of time the PWM signal is at the first level over each cycle, the duty cycle indicative of a desired velocity of the motor; and
      a PWM to analog voltage converter which converts the PWM signal to a corresponding analog voltage having a magnitude indicative of the duty cycle of the PWM signal, comprising:
         a current source which supplies a current at a selected magnitude;
         first and second sampling capacitors; and
         a ramp capacitor which, during successively occurring cycles of the PWM signal:
            (a) stores charge in response to application of the current to the ramp capacitor during substantially the entire duration of a first cycle;
            (b) transfers charge to the first sampling capacitor during a second cycle, the first sampling capacitor outputting a feedback voltage to adjust the magnitude of the current from the current source, the feedback voltage having a magnitude in relation to a magnitude of the charge transferred to the first sampling capacitor;
            (c) stores charge in response to application of the current to the ramp capacitor during a portion of a third cycle corresponding to the first level of the PWM signal; and
            (d) transfers charge to the second sampling capacitor during a fourth cycle, the second sampling capacitor outputting the analog voltage in relation to a magnitude of the charge transferred to the second sampling capacitor.

7. The disc drive of claim 6, wherein the motor control circuit further comprises a motor driver, responsive to the PWM to analog voltage converter, which applies a drive current to the motor having a magnitude determined in relation to the analog voltage.

8. The disc drive of claim 6, wherein the PWM to analog voltage converter further comprises a feedback circuit which controls the magnitude of the current source in relation to the feedback voltage.

9. The disc drive of claim 8, wherein the feedback circuit comprises an integrator.

10. The disc drive of claim 9, wherein the feedback circuit further comprises a transconductance amplifier.

11. A disc drive, comprising:
   a circuit which generates a pulse-width modulation (PWM) signal having a duty cycle indicative of a desired rotational velocity of a motor of the disc drive; and
   conversion means for converting the PWM signal to an analog voltage having a magnitude indicative of the duty cycle, the analog voltage used to control the rotational velocity of the motor.

12. The disc drive of claim 11, wherein the conversion means comprises:
- a current source which supplies electrical charge at a controllable rate;
- a ramp capacitor which, during selected, successively occurring cycles of the PWM signal, alternatively receives electrical charge from the current source and discharges previously received electrical charge;
- a first sampling capacitor which receives electrical charge from the ramp capacitor to output a feedback voltage to a feedback circuit to adjust the rate of electrical charge supplied by the current source; and
- a second sampling capacitor which receives electrical charge from the ramp capacitor to output the analog voltage.

13. A method for converting a pulse-width modulation (PWM) signal to an analog voltage, the PWM signal comprising a series of cycles each having a first and a second level and a duty cycle expressed as a percentage of time the PWM signal is at the first level over each cycle, the analog voltage having a magnitude indicative of the duty cycle, the method comprising steps of:
   (a) providing a current at a selected magnitude;
   (b) applying the current to a ramp capacitor over each of a plurality of successively occurring cycles to repetitively store charge on the ramp capacitor at a rate determined by the magnitude of the current;
   (c) transferring charge stored during a selected cycle from the ramp capacitor to a first sampling capacitor to output a feedback voltage used to adjust the magnitude of the current, the charge transferred to the first sampling capacitor determined in relation to the charge stored on the ramp capacitor over the entire cycle; and
   (d) transferring charge stored during a selected cycle from the ramp capacitor to a second sampling capacitor to output the analog voltage, the charge transferred to the second sampling capacitor determined in relation to the charge stored on the ramp capacitor while the PWM signal remains at the first level during said selected cycle.

14. The method of claim 13, wherein the analog voltage is used to control rotational velocity of a motor.

15. The method of claim 13, wherein the transferring step (a) comprises steps of:
   (a1) integrating the feedback voltage to generate an integrated voltage; and
   (a2) applying the integrated voltage to the current source to adjust the magnitude of the current.

* * * * *

UNITED STATES PATENT AND TRADEMARK OFFICE
CERTIFICATE OF CORRECTION

PATENT NO. : 6,208,280 B1
DATED : March 27, 2001
INVENTOR(S) : John M. Baker, Edward N. Jeffrey and Robert Whyte, Jr.

It is certified that error appears in the above-identified patent and that said Letters Patent is hereby corrected as shown below:

Title page,
Item [73], replace "[73] Assignee: Seagate Technology LLC" with -- [73] Assignee: Seagate Technology LLC, Scotts Valley, CA (US) and Texas Instruments Incorporated, Dallas, TX (US) --

Column 1,
Line 50, replace "made necessary" with -- make necessary --.

Column 6,
Lines 45 and 46, replace "third cycle. During remaining cycles" with -- third cycle. During remaining cycles --.

Signed and Sealed this

Twenty-second Day of October, 2002

Attest:

Attesting Officer

JAMES E. ROGAN
*Director of the United States Patent and Trademark Office*